US011983413B2

(12) United States Patent
Lee

(10) Patent No.: US 11,983,413 B2
(45) Date of Patent: May 14, 2024

(54) SEMICONDUCTOR MEMORY DEVICE FOR REDUCING DATA READ TIME DIFFERENCE BETWEEN MEMORY BANKS

(71) Applicant: FIDELIX CO., LTD., Seongnam-si (KR)

(72) Inventor: Jae Jin Lee, Gwangju-si (KR)

(73) Assignee: FIDELIX CO., LTD., Seongnam-si (KR)

( * ) Notice: Subject to any disclaimer, the term of this patent is extended or adjusted under 35 U.S.C. 154(b) by 51 days.

(21) Appl. No.: 17/979,111

(22) Filed: Nov. 2, 2022

(65) Prior Publication Data
US 2023/0266882 A1  Aug. 24, 2023

(30) Foreign Application Priority Data

Feb. 21, 2022 (KR) .......................... 10-2022-0022062

(51) Int. Cl.
*G06F 3/06* (2006.01)
(52) U.S. Cl.
CPC .......... *G06F 3/0613* (2013.01); *G06F 3/0629* (2013.01); *G06F 3/0659* (2013.01); *G06F 3/0679* (2013.01)

(58) Field of Classification Search
CPC .... G06F 3/0613; G06F 3/0629; G06F 3/0659; G06F 3/0679; G11C 7/08; G11C 8/12; G11C 11/4076; G11C 11/4087; G11C 11/4091; G11C 11/4096; G11C 11/4097; G11C 7/1048; G11C 7/22
See application file for complete search history.

(56) References Cited

U.S. PATENT DOCUMENTS

2022/0165319 A1* 5/2022 Yang .................... G11C 11/4096

* cited by examiner

*Primary Examiner* — Tasnima Matin
(74) *Attorney, Agent, or Firm* — KILE PARK REED & HOUTTEMAN PLLC

(57) ABSTRACT

Disclosed herein is a semiconductor memory device for reducing data read time difference between memory banks. In the semiconductor memory device of the disclosure, each of the memory banks has the delay control time controlled based on the distance from data control block or receives the signal according to the read command. Accordingly, the data read time difference is reduced in the semiconductor memory device, and the operation time margin of the data control block is improved.

16 Claims, 11 Drawing Sheets

SEMICONDUCTOR MEMORY DEVICE FOR REDUCING DATA READ TIME DIFFERENCE BETWEEN MEMORY BANKS

CROSS-REFERENCE TO RELATED APPLICATION

This application claims priority to and the benefit of Korean Patent Application No. 2022-0022062 under 35 U.S.C. § 119, filed on Feb. 21, 2022, in the Korean Intellectual Property Office (KIPO), the disclosure of which is incorporated herein by reference in its entirety.

BACKGROUND

1. Technical Field

The disclosure relates to a semiconductor memory device, and more particularly, to the semiconductor memory device for reducing the "data read time difference" between memory banks.

2. Description of the Related Art

In general, a semiconductor memory device includes memory banks positioned in a central region and a data control block positioned in a peripheral region.

Each of memory banks includes memory cells which are arranged in the matrix composed of word lines and bit lines.

The data control block generates a read command signal according to a read command. Then, the read command signal is loaded into a command wiring, and it is received by each of memory banks. Each of memory banks, when it is specified, amplifies the data of the selected memory cell in response to the activation of the read command signal. Then, the data of the selected memory cell, which is amplified, is loaded into a global data wiring as a global read data.

The data control block receives and buffers the global read data, which is loaded in the global data wiring. The data control block provides the buffered global read data to the outside.

However, there may be a distance difference for the data control block between the memory banks. In this case, in the time for the signal according to the read command from the data control block to arrive at each memory, a difference occurs depending on the distance of the corresponding memory bank to the data control block. Also, there may be a difference in the time at which the global read data loaded from each memory bank to global wiring reaches the data control block.

Then, a so-called "data read time" may be different for each memory bank. Here, the data read time means the time required for the data control block to receive the read data from generation of the read command.

In this case, there is a so-called "data read time difference" between the memory banks. As a result, in the data control block, an operation time margin required for buffering and providing the received global read data to the outside may be reduced.

SUMMARY

The disclosure is directed to a semiconductor memory device to reduce the "data read time difference" between memory banks.

According to an aspect of the disclosure, there is provided a semiconductor memory device comprising a peripheral region; a first central region and a second central region; a first memory bank disposed in the first central region and including a first memory array including memory cells; and a first data read driving part; a second memory bank disposed in the second central region and including a second memory array including memory cells; and a second data read driving part; a data control block disposed in the peripheral region and generating a first read confirmation signal and a second read confirmation signal according to a generation of a read command, wherein the first read confirmation signal is activated in response to the generation of the read command when a first bank enable signal is activated, and the first bank enable signal is activated according to a selection of the first memory bank, and the second read confirmation signal is activated in response to the generation of the read command when a second bank enable signal is activated, and the second bank enable signal is activated according to a selection of the second bank; a first command wiring extended from the data control block and wired through the first to the second central region, the first command wiring transferring the first read confirmation signal; a second command wiring extended from the data control block and wired through the first to the second central region, the second command wiring transferring the second read confirmation signal; and a global data wiring extended from the data control block and wired through the first to the second central region, the global data wiring transfers a global read data to the data control block. A distance from the peripheral region to the second central region is longer than a distance from the peripheral region to the first central region. The first data read driving part of the first memory bank receives, in the first central region, the first read confirmation signal transferred through the first command wiring, and amplifies a first read local data to provide the amplified first read local data as the global read data in the first central region to the global data wiring according to the activation of the first read confirmation signal, the first read local data being a cell data of a selected one of the memory cells of the first memory array. The second data read driving part of the second memory bank receives, in the second central region, the second read confirmation signal transferred through the second command wiring, and amplifies a second read local data to provide the amplified second read local data as the global read data in the second central region to the global data wiring according to the activation of the second read confirmation signal, the second read local data being a cell data of a selected one of the memory cells of the second memory array. A time from the generating of the read command to the provision of the first local read data to the global data wiring includes a first delay control time, and a time from the generating of the read command to the provision of the second local read data to the global data wiring includes a second delay control time. The second delay control time is shorter than the first delay control time.

An i-th data read driving part of an i-th memory bank may include a command delay part that receives an i-th read command confirmation signal transferred through the i-th command wiring in the i-th central region and delaying the i-th read command confirmation signal with the i-th delay control time to generate a column enable signal; and a data reading part enabled in response to the activation of the column enable signal, the data reading part being driven to amplify an i-th local read data to provide the amplified i-th local read data as the global read data to the global data wiring, and "i" may be a natural number from 1 to 2.

The data reading part may include a column decoder enabled in response to the activation of the column enable signal, the column decoder being driven to specify a bit line of a selected one of the memory cells of an i-th memory array; and a data sensing amplifier enabled in response to the activation of the column enable signal, the data sensing amplifier being driven to amplify the i-th local read data to provide the amplified i-th local read data as the global read data to the global data wiring in the i-th central region.

The second delay control time may be zero (0).

The data control block may include a command receiving part that generates a read command signal in response to the generation of the read command; a first confirmation generating part that generates the first read confirmation signal; and a second confirmation generating part that generates the second read confirmation signal.

According to other aspect of the disclosure, there is provided a semiconductor memory device comprising a peripheral region; a first central region and a second central region; a first memory bank disposed in the first central region and including a first memory array including memory cells; and a first data read driving part; a second memory bank disposed in the second central region and including a second memory array including memory cells; and a second data read driving part; a data control block disposed in the peripheral region and generating a first read confirmation signal and a second read confirmation signal according to the generation of a read command, wherein the first read confirmation signal is activated in response to the generation of the read command when a first bank enable signal is activated, and the first bank enable signal is activated according to a selection of the first memory bank, and the second read confirmation signal is activated in response to the generation of the read command when a second bank enable signal is activated, and the second bank enable signal is activated according to a selection of the second bank; a first command wiring extended from the data control block and wired through the first to the second central region, the first command wiring transferring the first read confirmation signal; a second command wiring extended from the data control block and wired through the first to the second central region, the second command wiring transferring the second read confirmation signal; a first auxiliary wiring wired through the first central region and the second central region, the first auxiliary wiring being electrically connected with the first command wiring in the second central region and transferring the first read confirmation signal; a second auxiliary wiring wired through the first central region and the second central region, the second auxiliary wiring being electrically connected with the second command wiring in the second central region and transferring the second read confirmation signal; and a global data wiring extended from the data control block and wired through the first to the second central region, the global data wiring transferring a global read data to the data control block. A distance from the peripheral region to the second central region is longer than a distance from the peripheral region to the first central region. The first data read driving part of the first memory bank receives, in the first central region, the first read confirmation signal transferred through the first auxiliary wiring, and amplifies a first read local data to provide the amplified first lead local data as the global read data in the first central region to the global data wiring according to the activation of the first read confirmation signal, the first read local data being a cell data of a selected one of the memory cells of the first memory array. The second data read driving part of the second memory bank receives, in the second central region, the second read confirmation signal transferred through the second auxiliary wiring, and amplifies a second read local data to provide the amplified second read local data as the global read data in the second central region to the global data wiring according to the activation of the second read confirmation signal, the second read local data being a cell data of a selected one of the memory cells of the second memory array.

7. The semiconductor memory device of claim 6, wherein the data control block may include a command receiving part that generates a read command signal in response to the generation of the read command; a first confirmation generating part that generates the first read confirmation signal; and a second confirmation generating part that generates the second read confirmation signal.

According to another aspect of the disclosure, there is provided a semiconductor memory device comprising a peripheral region; a first central region and a second central region; a first memory bank disposed in the first central region and including a first memory array including memory cells; a first confirmation generating part; and a first data read driving part; a second memory bank disposed in the second central region and including a second memory array including memory cells; a second confirmation generating part; and a second data read driving part; a data control block disposed in the peripheral region, the data control block generating a read command signal according to the generation of a read command, the read command signal being activated in response to the generation of the read command; a command wiring extended from the data control block and wired through in sequence the first to the second central region, the command wiring transferring the read command signal; and a global data wiring extended from the data control block and wired through in sequence the first to the second central region, the global data wiring transferring a global read data to the data control block. A distance from the peripheral region to the second central region is longer than a distance from the peripheral region to the first central region. The first confirmation generating part of the first memory bank receives, in the first central region, the read command signal transferred through the command wiring, and generates a first read confirmation signal, the first read confirmation signal being activated in response to the activation of the read command signal when a first bank enable signal is activated, and the first bank enable signal being activated according to a selection of the first memory bank. The second confirmation generating part of the second memory bank receives, in the second central region, the read command signal transferred through the command wiring, and generates a second read confirmation signal, the second read confirmation signal being activated in response to the activation of the read command signal when a second bank enable signal is activated, and the second bank enable signal being activated according to a selection of the second memory bank. The first data read driving part of the first memory bank receives the first read confirmation signal, and amplifies a first read local data to provide the amplified first read local data as the global read data in the first central region to the global data wiring according to the activation of the first read confirmation signal, the first read local data being a cell data of a selected one of the memory cells of the first memory array. The second data read driving part of the second memory bank receives the second read confirmation signal, and amplifies a second read local data to provide the amplified second read local data as the global read data in the second central region to the global data wiring according to the activation of the second read confirmation signal, the second read local data being a cell data of a selected one of the memory cells of the second memory array. A time from the generating of the read command to the provision of the first local read data to the global data wiring includes a first delay control time, and a from the generating of the read command to the provision of the second local read data to the global data wiring includes a second delay control time. The second delay control time is shorter than the first delay control time.

An i-th data read driving part of an i-th memory bank may include a command delay part that receives an i-th read command confirmation signal and delaying the i-th read command confirmation signal with the i-th delay control time to generate a column enable signal; and a data reading part enabled in response to the activation of the column enable signal and driven to amplify the i-th local read data to provide the amplified i-th local read data as the global read data to the global data wiring, and "i" may be a natural number from 1 to 2.

The data reading part may include a column decoder enabled in response to the activation of the column enable signal and driven to specify a bit line of a selected one of the memory cells of an i-th memory array; and a data sensing amplifier enabled in response to the activation of the column enable signal and driven to amplify the i-th local read data to provide the amplified i-th local read data as the global read data to the global data wiring in the i-th central region.

The second delay control time may be zero (0).

According to another aspect of the disclosure, there is provided a semiconductor memory device comprising a peripheral region; a first central region and a second central region; a first memory bank disposed in the first central region and including a first memory array including memory cells; a first confirmation generating part; and a first data read driving part; a second memory bank disposed in the second central region and including a second memory array including memory cells; a second confirmation generating part; and a second data read driving part; a data control block disposed in the peripheral region, the data control block generating a read command signal according to the generation of a read command, the read command signal being activated in response to the generation of the read command; a command wiring extended from the data control block and wired through the first to the second central region, the command wiring transferring the read command signal; an auxiliary wiring wired through the first central region and the second central region, the auxiliary wiring being electrically connected with the command wiring in the second central region and transferring a read confirmation signal; and a global data wiring extended from the data control block and wired through the first to the second central region, the global data wiring transferring a global read data to the data control block. A distance from the peripheral region to the second central region is longer than a distance from the peripheral region to the first central region.

The first confirmation generating part of the first memory bank may receive, in the first central region, the read command signal transferred through the auxiliary wiring, and may generate a first read confirmation signal, the first read confirmation signal may be activated in response to the activation of the read command signal when a first bank enable signal is activated, and the first bank enable signal may be activated according to a selection of the first memory bank.

The second confirmation generating part of the second memory bank may receive, in the second central region, the read command signal transferred through the auxiliary wiring, and may generate a second read confirmation signal, the second read confirmation signal may be activated in response to the activation of the read command signal when a second bank enable signal is activated, and the second bank enable signal may be activated according to a selection of the second memory bank.

The first data read driving part of the first memory bank may receive the first read confirmation signal, and may amplify a first read local data to provide the amplified first read local data as the global read data in the first central region to the global data wiring according to the activation of the first read confirmation signal, and the first read local data may be a cell data of a selected one of the memory cells of the first memory array.

The second data read driving part of the second memory bank may receive the second read confirmation signal, and may amplify a second read local data to provide the amplified second read local data as the global read data in the second central region to the global data wiring according to the activation of the second read confirmation signal, and the second read local data may be a cell data of a selected one of the memory cells of the second memory array.

BRIEF DESCRIPTION OF THE DRAWINGS

The above and other objects, features and advantages of the disclosure will become more apparent to those skilled in the art by describing in detail embodiments thereof with reference to the accompanying drawings, in which.

DETAILED DESCRIPTION OF THE EMBODIMENTS

Figure 1:
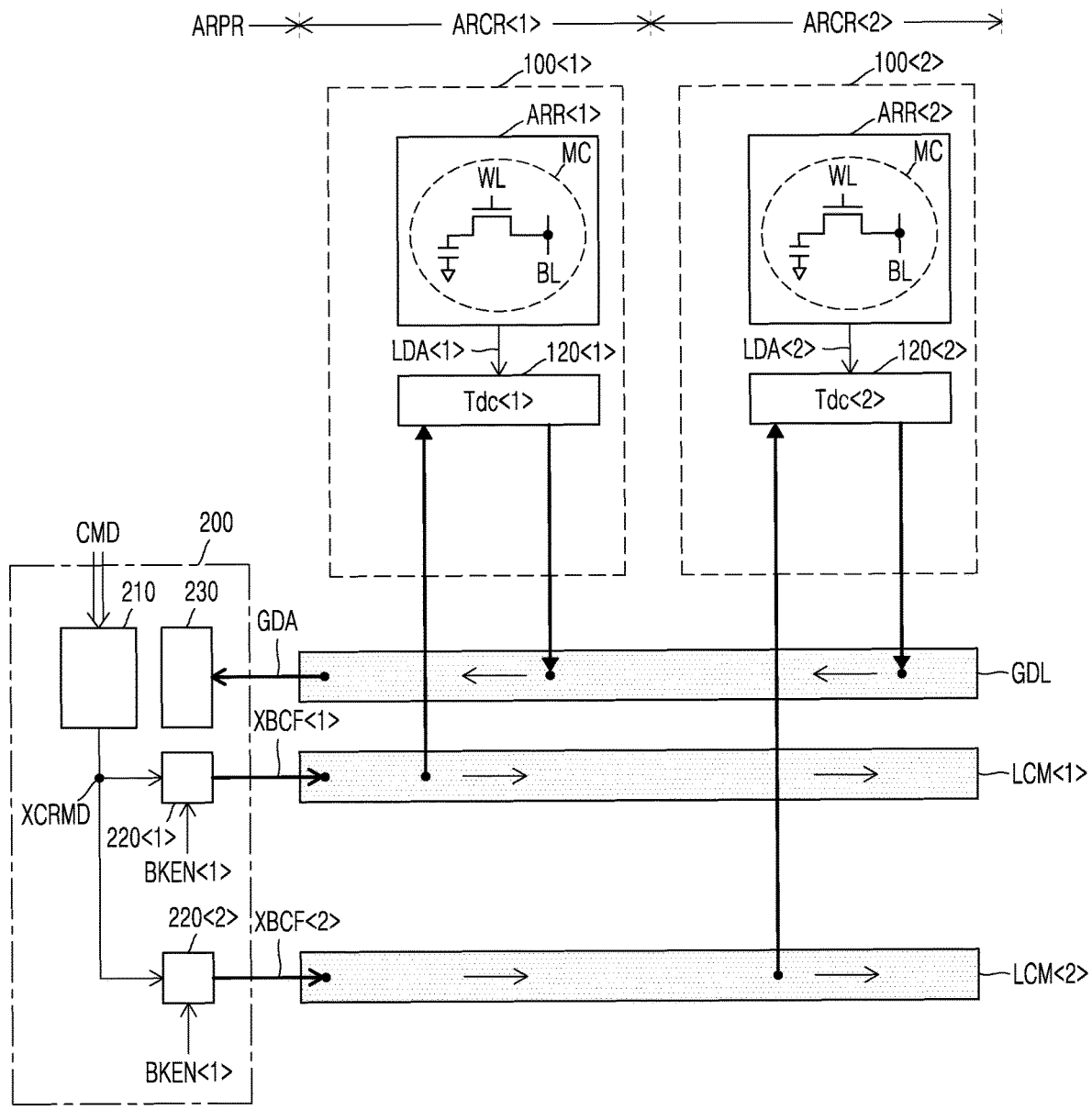
FIG. 1 is a schematic view showing a semiconductor memory device according to a first embodiment of the disclosure.

Embodiments of the disclosure will be described in detail below with reference to the accompanying drawings. While the disclosure is shown and described in connection with embodiments thereof, it will be apparent to those skilled in the art that various modifications can be made without departing from the spirit and scope of the disclosure. Thus, the scope of the disclosure is not limited to these particular following embodiments.

The terminology used herein is for the purpose of describing particular embodiments only and is not intended to be limiting of the disclosure. As used herein, the singular forms "a" and "an" are intended to include the plural forms as well, unless the context clearly indicates otherwise. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

The term "and/or" includes all combinations of one or more of which associated configurations may define. For example, "A and/or B" may be understood to mean "A, B, or A and B."

For the purposes of this disclosure, the phrase "at least one of A and B" may be construed as A only, B only, or any combination of A and B. Also, "at least one of X, Y, and Z" and "at least one selected from the group consisting of X, Y, and Z" may be construed as X only, Y only, Z only, or any combination of two or more of X, Y, and Z.

As customary in the field, some embodiments are described and illustrated in the accompanying drawings in terms of functional blocks, units, and/or modules. Those skilled in the art will appreciate that these blocks, units, and/or modules are physically implemented by electronic (or optical) circuits, such as logic circuits, discrete components, microprocessors, hard-wired circuits, memory elements, wiring connections, and the like, which may be formed using semiconductor-based fabrication techniques or other manufacturing technologies. In the case of the blocks, units, and/or modules being implemented by microprocessors or other similar hardware, they may be programmed and controlled using software (e.g., microcode) to perform various functions discussed herein and may optionally be driven by firmware and/or software. It is also contemplated that each block, unit, and/or module may be implemented by dedicated hardware, or as a combination of dedicated hardware to perform some functions and a processor (e.g., one or more programmed microprocessors and associated circuitry) to perform other functions. Also, each block, unit, and/or module of some embodiments may be physically separated into two or more interacting and discrete blocks, units, and/or modules without departing from the scope of the disclosure. Further, the blocks, units, and/or modules of some embodiments may be physically combined into more complex blocks, units, and/or modules without departing from the scope of the disclosure.

Unless otherwise defined or implied herein, all terms (including technical and scientific terms) used herein have the same meaning as commonly understood by those skilled in the art to which this disclosure pertains. It will be further understood that terms, such as those defined in commonly used dictionaries, should be interpreted as having a meaning that is consistent with their meaning in the context of the relevant art and the disclosure, and should not be interpreted in an ideal or excessively formal sense unless clearly so defined herein.

Hereinafter, embodiments of the disclosure will be described in detail with reference to the accompanying drawings.

At this time, the semiconductor memory device according to the embodiments of the disclosure includes a peripheral region, a first central region and a second central region. Herein, the first central region and the second central region are virtual regions.

First Embodiment

FIG. 1 is a schematic view showing a semiconductor memory device according to a first embodiment of the disclosure. In the semiconductor memory device of FIG. 1, there may be a peripheral region ARPR, a first central region ARCR<1> and a second central region ARCR<2>.

The first central region ARCR<1> and the second central region ARCR<2> may be positioned at a distance (e.g., a sequentially increasing distance) from peripheral region ARPR. For example, a distance from the peripheral region ARPR to the second central region ARCR<2> may be longer than a distance from the peripheral region ARPR to the first central ARCR<1>.

The semiconductor memory device of FIG. 1 may include a first memory bank 100<1>, a second memory bank 100<2>, a data control block 200, a first command wiring LCM<1>, a second command wiring LCM<2> and a global data wiring GDL.

The first memory bank 100<1> may be disposed in the first central region ARCR<1>. The first memory bank 100<1> may include a first memory array ARR<1> and a first data read driving part 120<1>.

The first memory array ARR<1> may include memory cells MCs, which are arranged in the matrix composed of word lines WLs and bit lines BLs.

The second memory bank 100<2> may be disposed in the second central region ARCR<2>. The second memory bank 100<2> may include a second memory array ARR<2> and a second data read driving part 120<2>.

The second memory array ARR<2> may include memory cells MCs, which are arranged in the matrix composed of word lines WLs and bit lines BLs.

In this specification, for simplicity of explanation, the detailed description of the configuration and specification of the memory cell MC, and the process of reading the cell data from the memory cell MC are omitted.

The data control block 200 may be disposed in the peripheral area ARPR. The data control block 200 may generate a first read confirmation signal XBCF<1> and a second read confirmation signal XBCF<2> according to the read command CMD.

The first read confirmation signal XBCF<1> may be activated in response to the generation of the read command CMD when a first bank enable signal BKEN<1> is activated. The first bank enable signal BKEN<1> may be activated according to the selection of the first memory bank 100<1>.

The second read confirmation signal XBCF<2> may be activated in response to the generation of the read command CMD when a second bank enable signal BKEN<2> is activated. The second bank enable signal BKEN<2> may be activated according to the selection of the second memory bank 100<2>.

The data control block 200 may receive and buffer the global read data GDA, which is loaded in the global data wiring GDL. The data control block 200 may provide the buffered global read data GDA to the outside.

The first command wiring LCM<1> may be extended from the data control block 200. The first command wiring LCM<1> may be wired through the first to the second central region ARCR<1> to ARCR<2>.

The first command wiring LCM<1> may transfer the first read confirmation signal XBCF<1>, which is generated from the data control block 200.

The second command wiring LCM<2> may be extended from the data control block 200. The second command wiring LCM<2> may be wired through the first to the second central region ARCR<1> to ARCR<2>.

The second command wiring LCM<2> may transfer the second read confirmation signal XBCF<2>, which is generated from the data control block 200.

The global data wiring GDL may be extended from the data control block 200. The global data wiring GDL may be wired through the first to the second central region ARCR<1> to ARCR<2>. The global data wiring GDL may transfer a global read data GDA to the data control block 200.

The first data read driving part 120<1> may receive the first read confirmation signal XBCF<1> in the first central region ARCR<1>. Here, the first read confirmation signal XBCF<1> may be transferred through the first command wiring LCM<1>. The first data read driving part 120<1> may amplify a first read local data LDA<1>. The amplified first read local data LDA<1> may be provided, as the global read data GDA, to the global data wiring GDL in the first central region ARCR<1> according to the activation of the first read confirmation signal XBCF<1>. The first read local data LDA<1> may be the cell data of the selected memory cell MC of the first memory bank ARR<1>.

The time from the generating of the read command CMD to the providing of the first local read data LDA<1> to the global data wiring GDL may include a first delay control time Tdc<1>.

The second data read driving part 120<2> may receive the second read confirmation signal XBCF<2> in the second central region ARCR<2>. The second read confirmation signal XBCF<2> may be transferred through the second command wiring LCM<2>. The second data read driving part 120<2> may amplify a second read local data LDA<2>. The amplified second read local data LDA<2> may be provided, as the global read data GDA, to the global data wiring GDL in the second central region ARCR<2> according to the activation of the second read confirmation signal XBCF<2>. The second read local data LDA<2> may be the cell data of the selected memory cell MC of the second memory bank ARR<2>.

The time from the generating of the read command CMD to the providing of the second local read data LDA<2> to the global data wiring GDL may include a second delay control time Tdc<2>.

In the semiconductor memory device of FIG. 1, the second delay control time Tdc<2> may be shorter than the first delay control time Tdc<1>.

The second delay control time Tdc<2> may be zero (0).

Figure 2:
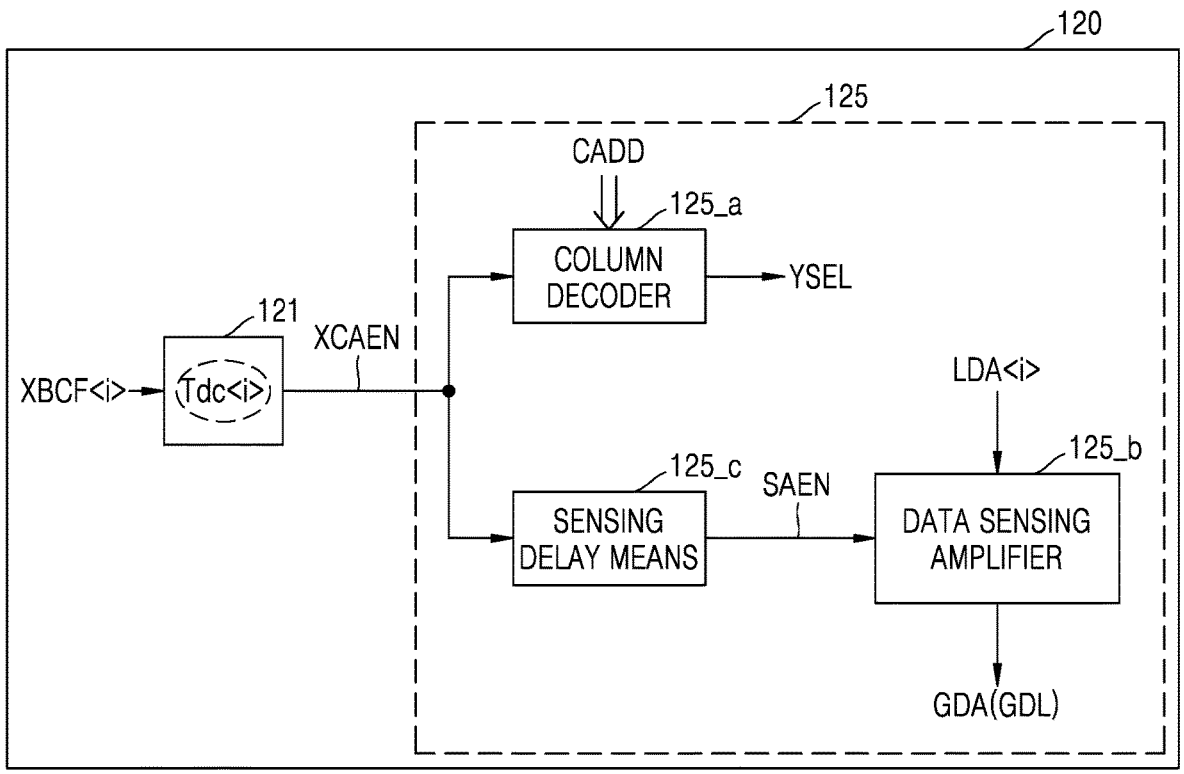
FIG. 2 is a schematic diagram illustrating one of data read driving parts of FIG. 1.

FIG. 2 is a schematic diagram illustrating one of data read driving parts 120 of FIG. 1. Representatively, the i-th data read driving part 120<i> of an i-th memory bank<i> is illustrated in FIG. 2 (here, "i" is a natural number from 1 to 2).

Referring to FIG. 2, the data read driving part 120<i> of the i-th memory bank<i> may include a command delay part 121 and a data reading part 125.

The command delay part 121 may receive the i-th read command confirmation signal XBCF<i> in the i-th central region ARCR<i>. The i-th read command confirmation signal XBCF<i> may be transferred through the i-th command wiring LCM<i>. The command delay part 121 may delay the i-th read command confirmation signal XBCF<i> with the i-th delay control time Tdc<i> to generate a column enable signal XCAEN.

The data reading part 125 may be enabled in response to the activation of the column enable signal XCAEN. The data reading part 125 may be driven to provide the global read data GDA to the global data wiring GDL in the i-th central region ARCR<i> with amplifying the i-th local read data LDA<i>.

The data reading part 125 may include a column decoder 125_a and a data sensing amplifier 125_b.

The column decoder 125_a may be enabled in response to the activation of the column enable signal XCAEN. The column decoder 125_a may generate a column selection signal YSEL with decoding a column address CADD. The bit line BL of the selected memory cell MC in the i-th memory array ARR<i> is specified by the column selection signal YSEL.

In this specification, for simplicity of explanation, the detailed description of the configuration and specification of the column decoder 125_a are omitted.

The data sensing amplifier 125_b may be enabled in response to the activation of a sensing enable signal SAEN. A sensing delay part 125_c may delay the column enable signal XCAEN to generate a sensing enable signal SAEN. For example, the data sensing amplifier 125_b may be enabled in response to the activation of the column enable signal XCAEN.

The data sensing amplifier 125_b may be driven to provide the global read data GDA to the global data wiring GDL in the i-th central region ARCR<i> with amplifying the i-th local read data LDA<i>. The i-th local read data LDA<i> may be a differential type data, and the data sensing amplifier 125_b may also be implemented in the form of a differential type amplifier.

In this specification, for simplicity of explanation, the detailed description of the configuration and specification of the data sensing amplifier 125_b are omitted.

Referring again to FIG. 1, the data control block 200 may include a command receiving part 210, a first confirmation generating part 220<1>, a second confirmation generating part 220<2> and a global data receiving part 230.

The command receiving part 210 may generate a read command signal XCRMD in response to the generation of the read command CMD.

The first confirmation generating part 220<1> may generate the first read confirmation signal XBCF<1>. The first read confirmation signal XBCF<1> may be activated in response to the activation of the read command signal XCRMD when the first bank enable signal BKEN<1> is activated.

The second confirmation generating part 220<2> may generate the second read confirmation signal XBCF<2>. The second read confirmation signal XBCF<2> may be activated in response to the activation of the read command signal XCRMD when the second bank enable signal BKEN<2> is activated.

The global data receiving part 230 may receive and recognize the global read data GDA, which is loaded in the global data wiring GDL. The global data receiving part 230 may provide the received global read data GDA to the outside.

According to the semiconductor memory device of FIG. 1, the "data read time difference" between the first memory bank 100<1> and the second memory bank 100<2> may be significantly reduced.

Figure 3:
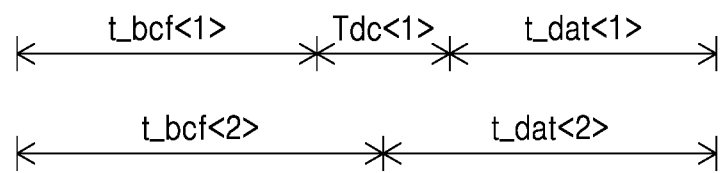
FIG. 3 is a drawing for explaining the reduction of the data read time difference in the semiconductor memory device of FIG. 1.

FIG. 3 is a drawing for explaining the reduction of the data read time difference in the semiconductor memory device of FIG. 1.

In FIG. 3, the time required for the read confirmation signal XBCF generated in the data control block 200 to arrive at each memory bank 100 through the command wiring LCM from the time when the read command CMD is generated is called as "command arrival time t_bcf."

The time required for the global read data GDA to arrive at the data control block 200 from the time when the global read data GDA is loaded into the global data wiring GDL is called as "data arrival time t_dat."

The time taken from the time when the read confirmation signal XBCF arrives at each memory bank 100 to the time when the global read data GDA is loaded into the global data wiring GDL may be the difference according to a delay control time Tdc between the respective memory banks. The other time may be substantially the same. Therefore, in this specification, description of the time other than the delay control time Tdc is omitted for convenience of description.

The sum of the "command arrival time t_bcf" and the "data arrival time t_dat" can be called as the "data read time" of the corresponding memory bank 100. There may be a distance difference for the data control block 200 between the first memory bank 100<1> and the second memory bank 100<2>. Accordingly, there may be a difference in the "data read time" between the first memory bank 100<1> and the second memory bank 100<2>.

The difference in the "data read time" can be called as "data read time difference."

Continuously referring to FIG. 3, the command arrival time t_bcf<1> and the data arrival time t_dat<1> of the first memory bank 100<1> located relatively close to the data control block 200 may be shorter, than the command arrival time t_bcf<2> and the data arrival time t_dat<2> of the second memory bank 100<2> located relatively far away to the data control block 200.

However, in the first memory bank 100<1> located relatively close to the data control block 200, the time taken from the time when the read confirmation signal XBCF arrives at the first memory bank 100<1> to the time when the global read data GDA is loaded into the global data wiring GDL may include the first delay control time Tdc<1>.

Accordingly, the "data read time difference" according to the distance difference for the data control block 200 between the first memory bank 100<1> and the second memory bank 100<2> may be reduced. The "data read time difference" may be '0'

At this time, it is assumed that the second delay control time Tdc<2> is "0."

As a result, according to the semiconductor memory device of FIG. 1, the operation margin of the data control block 200 can be greatly improved.

Figure 4:
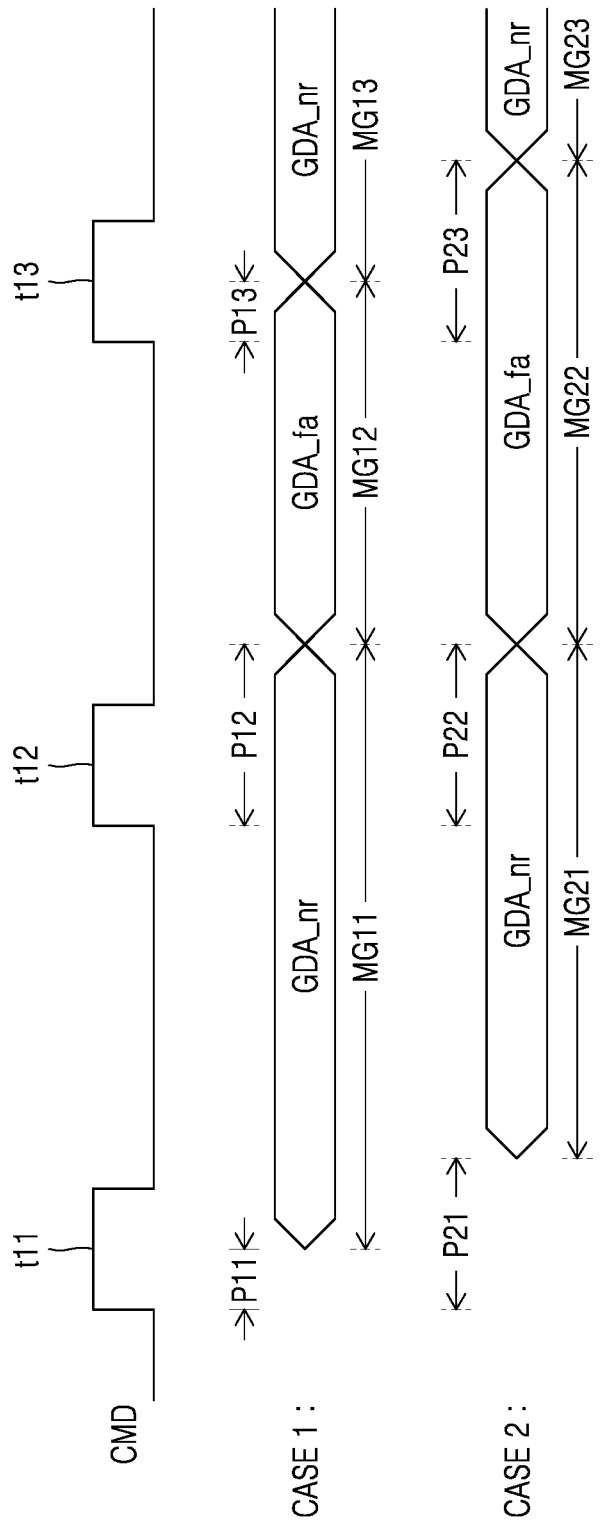
FIG. 4 is a drawing for explaining the effect of in the semiconductor memory device of FIG. 1.

FIG. 4 is a drawing for explaining the effect of in the semiconductor memory device of FIG. 1, and shows that the operation time margin of the data control block 200 is improved.

In FIG. 4, the data control block 200 may receive the global read data GDA_nr, which is read from the first memory bank 100<1>, according to the first generation t11 of the read command CMD. The data control block 200 may receive the global read data GDA_fa, which is read from the second memory bank 100<2>, according to the second generation t12 of the read command CMD. Also, the data control block 200 may receive the global read data GDA_nr, which is read from the first memory bank 100<1>, according to the third generation t13 of the read command CMD.

CASE 1 shows the operation time margin of the data control block 200 when there is no delay control time of both of the first memory bank 100<1> and of the second memory bank 100<2>. This case can be understood as showing the conventional technology.

CASE 2 shows the operation time margin of the data control block 200 when there are the first delay control time Tdc<1> and the second delay control time Tdc<2> for the first memory bank 100<1> and the second memory bank 100<2>, respectively. This case can be understood as showing the disclosure.

In CASE 1, the time interval P12 from the second generation of the read command CMD to the reception of the global read data GDA_fa of the data control block 200 is longer than each of the time intervals P11 and P13 from the first and the third generation of the read command CMD to the reception of the global read data GDA_fa of the data control block 200. In this case, the operation time margin MG12 of the data control block 200 according to the second generation of the read command CMD is smaller than each of the operation time margins MG11 and MG13 of the data control block 200 according to the first and the third generation of the read command CMD.

In CASE 2, the time interval P22 from the second generation of the read command CMD to the reception of the global read data GDA_fa of the data control block 200 can be controlled to be substantially the same as each of the time intervals P21 and P23 from the first and the third generation of the read command CMD to the reception of the global read data GDA_fa of the data control block 200. In this case, the operation time margin MG22 of the data control block 200 according to the second generation of the read command CMD may be substantially the same as each of the operation time margins MG21 and MG23 of the data control block 200 according to the first and the third generation of the read command CMD.

Accordingly, the operation time margin MG22 of the data control block 200 according to the second generation of the read command CMD in CASE 2 may be greater than the operation time margin MG12 of the data control block 200 according to the second generation of the read command CMD in CASE 1.

Thus according to the semiconductor memory device of FIG. 1, operation time margin of the data control block 200 may be greatly improved.

The operation time margin of the data control block 200 that buffers and provides the global read data GDA to the outside may be based on the second memory bank 100<2> located at the farthest location. Therefore, the decrease in operating speed of the semiconductor memory device hardly occurs.

Meanwhile, the semiconductor memory device according to the first embodiment can be modified in various forms.

Second Embodiment

Figure 5:
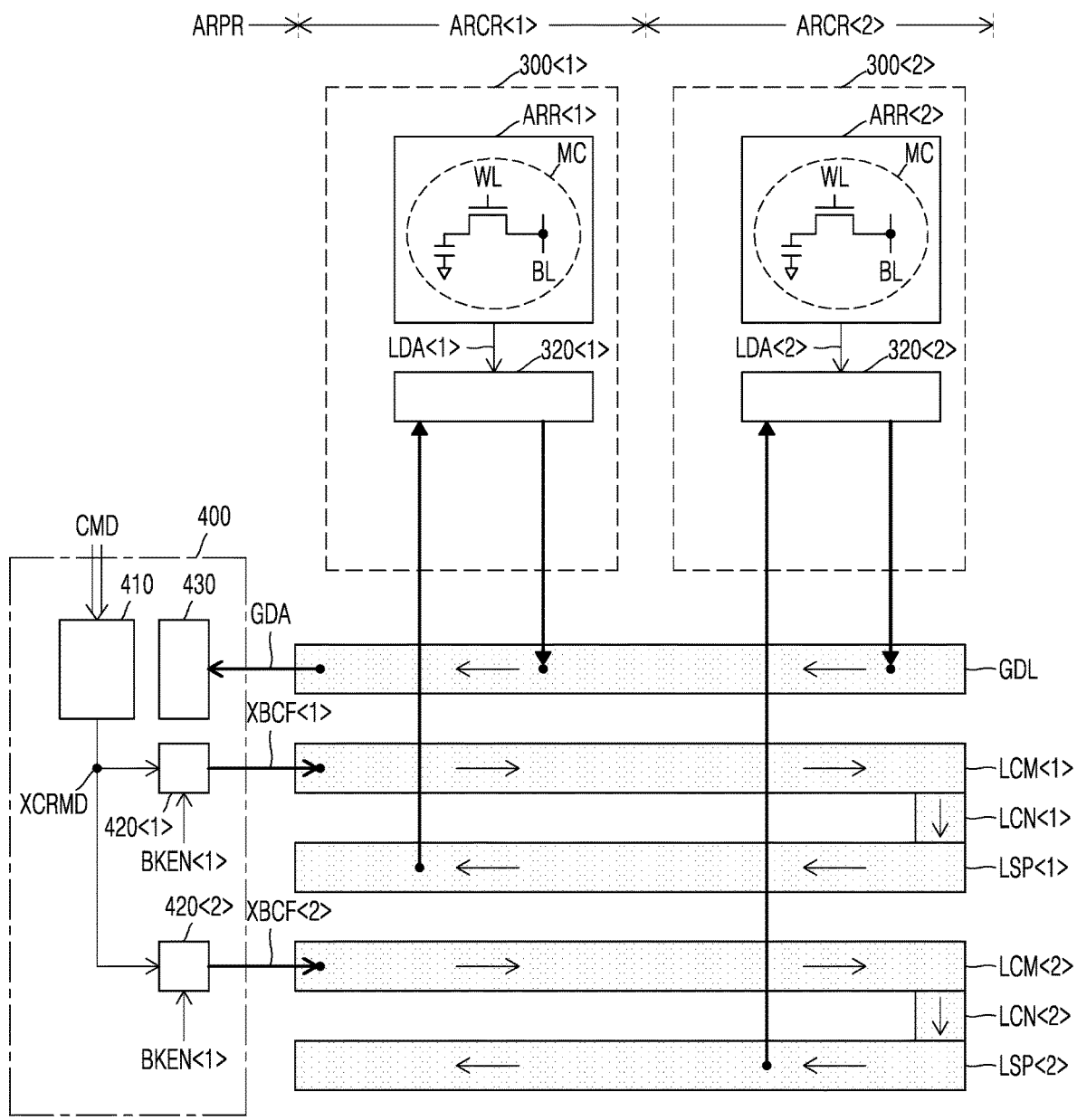
FIG. 5 is a schematic view showing a semiconductor memory device according to a second embodiment of the disclosure.

FIG. 5 is a schematic view showing a semiconductor memory device according to a second embodiment of the disclosure. In the semiconductor memory device of FIG. 5, there may be a peripheral region ARPR, a first central region ARCR<1> and a second central region ARCR<2>.

The first central region ARCR<1> and the second central region ARCR<2> may be positioned at a distance (e.g., a sequentially increasing distance) from peripheral region ARPR. For example, the distance from the peripheral region ARPR to the second central region ARCR<2> may be longer than the distance from the from the peripheral region ARPR to the first central ARCR<1>.

The semiconductor memory device of FIG. 5 may include a first memory bank 300<1>, a second memory bank 300<2>, a data control block 400, a first command wiring LCM<1>, a second command wiring LCM<2>, a first auxiliary wiring LSP<1>, a second auxiliary wiring LSP<2> and a global data wiring GDL.

The first memory bank 300<1> may be disposed in the first central region ARCR<1>. The first memory bank 300<1> may include a first memory array ARR<1> and a first data read driving part 320<1>.

The first memory array ARR<1> may include memory cells MCs, which are arranged in the matrix composed of word lines WLs and bit lines BLs.

The second memory bank 300<2> may be disposed in the second central region ARCR<2>. The second memory bank 300<2> may include a second memory array ARR<2> and a second data read driving part 320<2>.

The second memory array ARR<2> may include memory cells MCs, which are arranged in the matrix composed of word lines WLs and bit lines BLs.

In this specification, for simplicity of explanation, the detailed description of the configuration and specification of the memory cell MC, and the process of reading the cell data from the memory cell MC are omitted.

The data control block 400 may be disposed in the peripheral area ARPR. The data control block 400 may generate a first read confirmation signal XBCF<1> and a second read confirmation signal XBCF<2> according to the read command CMD.

The first read confirmation signal XBCF<1> may be activated in response to the generation of the read command CMD when a first bank enable signal BKEN<1> is activated. The first bank enable signal BKEN<1> may be activated according to the selection of the first memory bank 300<1>.

The second read confirmation signal XBCF<2> may be activated in response to the generation of the read command CMD when a second bank enable signal BKEN<2> is activated. The second bank enable signal BKEN<2> may be activated according to the selection of the second memory bank 300<2>.

The data control block 400 may receive and buffer the global read data GDA, which is loaded in the global data wiring GDL. The data control block 400 may provide the buffered global read data GDA to the outside.

The first command wiring LCM<1> may be extended from the data control block 400. The first command wiring LCM<1> may be wired through the first to the second central region ARCR<1> to ARCR<2>.

The first command wiring LCM<1> may transfer the first read confirmation signal XBCF<1>, which is generated from the data control block 400.

The second command wiring LCM<2> may be extended from the data control block 400. The second command wiring LCM<2> may be wired through the first to the second central region ARCR<1> to ARCR<2>.

The second command wiring LCM<2> may transfer the second read confirmation signal XBCF<2>, which is generated from the data control block 400.

The first auxiliary wiring LSP<1> may be wired through the first central region ARCR<1> and the second central region ARCR<2>. The first auxiliary wiring LSP<1> may be electrically connected with the first command wiring LCM<1> in the second central region ARCR<2> and transfer the first read confirmation signal XBCF<1>.

The second auxiliary wiring LSP<2> may be wired through the first central region ARCR<1> and the second central region ARCR<2>. The second auxiliary wiring LSP<2> may be electrically connected with the second command wiring LCM<2> in the second central region ARCR<2> and transfer the second read confirmation signal XBCF<2>.

The global data wiring GDL may be extended from the data control block 400. The global data wiring GDL may be wired through the first to the second central region ARCR<1> to ARCR<2>. The global data wiring GDL may transfer a global read data GDA to the data control block 400.

The first data read driving part 320<1> may receive the first read confirmation signal XBCF<1> in the first central region ARCR<1>. Here, the first read confirmation signal XBCF<1> may be transferred through the first auxiliary wiring LSP<1>. The first data read driving part 320<1> may amplify a first read local data LDA<1>. The amplified first read local data LDA<1> may be provided, as the global read data GDA, to the global data wiring GDL in the first central region ARCR<1> according to the activation of the first read confirmation signal XBCF<1>. The first read local data LDA<1> may be the cell data of the selected memory cell MC of the first memory bank ARR<1>.

The second data read driving part 320<2> may receive the second read confirmation signal XBCF<2> in the second central region ARCR<2>. Here, the second read confirmation signal XBCF<2> may be transferred through the second auxiliary wiring LSP<2>. The second data read driving part 320<2> may amplify a second read local data LDA<2>. The amplified second read local data LDA<2> may be provided, as the global read data GDA, to the global data wiring GDL in the second central region ARCR<2> according to the activation of the second read confirmation signal XBCF<2>. The second read local data LDA<2> may be the cell data of the selected memory cell MC of the second memory bank ARR<2>.

Continuously referring again to FIG. 5, the data control block 400 may include a command receiving part 410, a first confirmation generating part 420<1>, a second confirmation generating part 420<2> and a global data receiving part 430.

The command receiving part 410 may generate a read command signal XCRMD in response to the generation of the read command CMD.

The first confirmation generating part 420<1> may generate the first read confirmation signal XBCF<1>. The first read confirmation signal XBCF<1> may be activated in response to the activation of the read command signal XCRMD when the first bank enable signal BKEN<1> is activated.

The second confirmation generating part 420<2> may generate the second read confirmation signal XBCF<2>. The second read confirmation signal XBCF<2> may be activated in response to the activation of the read command signal XCRMD when the second bank enable signal BKEN<2> is activated.

The global data receiving part 430 may receive and recognize the global read data GDA, which is loaded in the global data wiring. The global data receiving part 430 may provide the received global read data GDA to the outside.

According to the semiconductor memory device of FIG. 5, the "data read time difference" between the first memory bank 300<1> and the second memory bank 300<2> is significantly reduced.

Figure 6:
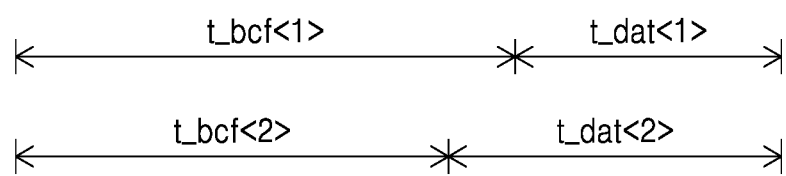
FIG. 6 is a drawing for explaining the reduction of the data read time difference in the semiconductor memory device of FIG. 5.

FIG. 6 is a drawing for explaining the reduction of the data read time difference in the semiconductor memory device of FIG. 5.

In FIG. 6, the time required for the read confirmation signal XBCF generated in the data control block 400 to arrive at each memory bank 300 through the command wiring LCM and the auxiliary wiring LSP from the time when the read command CMD is generated is called as "command arrival time t_bcf."

The time required for the global read data GDA to arrive at the data control block 400 from the time when the global read data GDA is loaded into the global data wiring GDL is called as "data arrival time t_dat."

The time taken from the time when the read confirmation signal XBCF arrives at each memory bank 300 to the time when the global read data GDA is loaded into the global data wiring GDL may be substantially the same. Therefore, in this specification, these times are not discussed in detail for convenience of description.

The sum of the "command arrival time t_bcf" and the "data arrival time t_dat" can be called as the "data read time" of the corresponding memory bank 300. There may be a distance difference for the data control block 400 between the first memory bank 300<1> and the second memory bank 300<2>. Accordingly, there may be a difference in the "data read time" between the first memory bank 300<1> and the second memory bank 300<2>.

The difference in the "data read time" can be called as "data read time difference."

Continuously referring to FIG. 6, the data arrival time t_dat<1> of the first memory bank 300<1> located relatively close to the data control block 400 may be shorter than the data arrival time t_dat<2> of the second memory bank 300<2> located relatively far away to the data control block 400.

However, the command arrival time t_bcf<1> of the first memory bank 300<1> located relatively close to the data control block 400 may be longer than the command arrival time t_bcf<2> of the second memory bank 300<2> located relatively far away to the data control block 400.

Accordingly, the "data read time difference" according to the distance difference for the data control block 400 between the first memory bank 300<1> and the second memory bank 300<2> is reduced. The "data read time difference" may be "0."

As a result, according to the semiconductor memory device of FIG. 5, there may be an effect that the operation margin of the data control block 400 is greatly improved, similar to the semiconductor memory device of FIG. 1.

Third Embodiment

Figure 7:
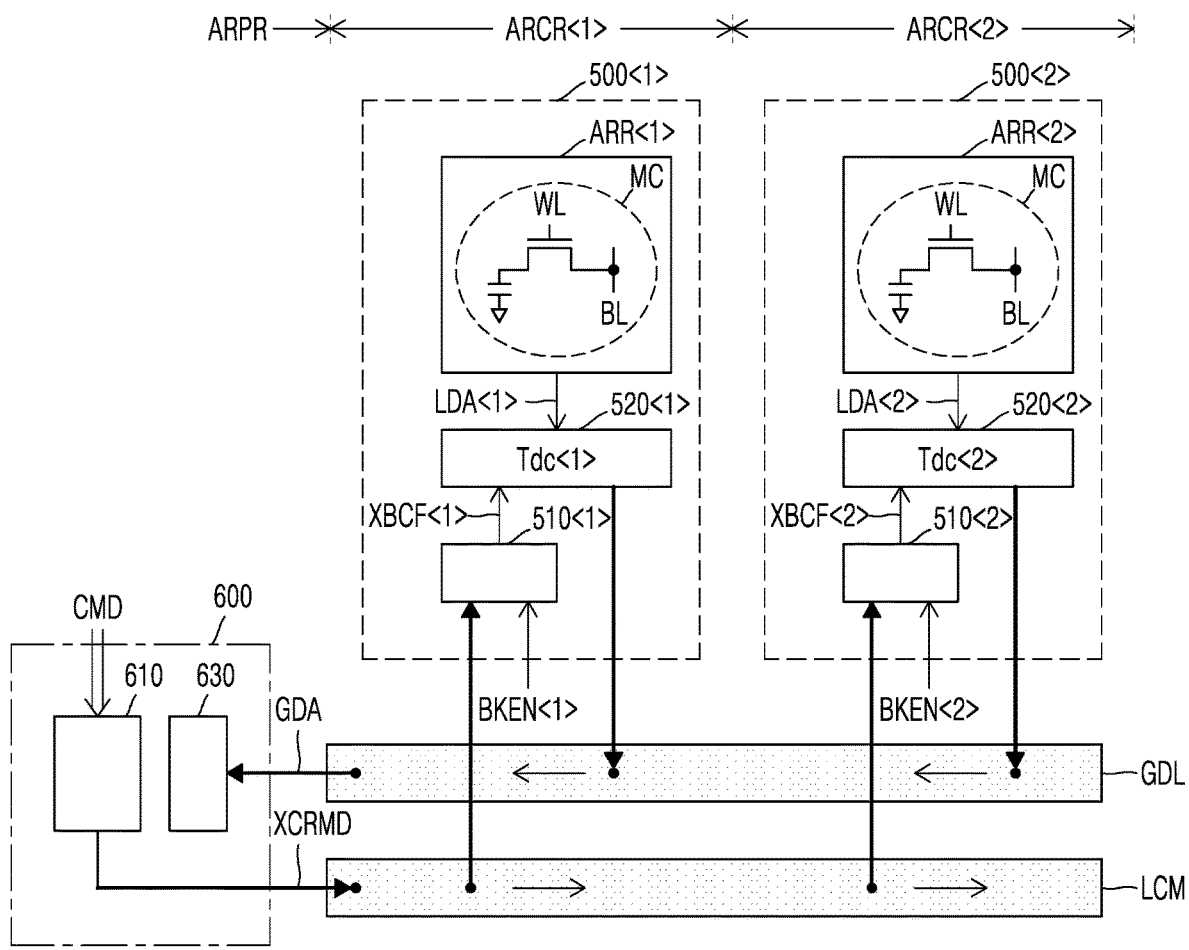
FIG. 7 is a schematic view showing a semiconductor memory device according to a third embodiment of the disclosure.

FIG. 7 is a schematic view showing a semiconductor memory device according to a third embodiment of the disclosure. In the semiconductor memory device of FIG. 7, there are a peripheral region ARPR, a first central region ARCR<1> and a second central region ARCR<2>.

The first central region ARCR<1> and the second central region ARCR<2> may be positioned at a sequentially increasing distance from peripheral region ARPR. For example, the distance from the peripheral region ARPR to the second central region ARCR<2> may be longer than the distance from the peripheral region ARPR to the first central ARCR<1>.

The semiconductor memory device of FIG. 7 may include a first memory bank 500<1>, a second memory bank 500<2>, a data control block 600, a command wiring LCM and a global data wiring GDL.

The first memory bank 500<1> may be disposed in the first central region ARCR<1>. The first memory bank 500<1> may include a first memory array ARR<1>, a first confirmation generating part 510<1> and a first data read driving part 520<1>.

The first memory array ARR<1> may include memory cells MCs, which are arranged in the matrix composed of word lines WLs and bit lines BLs.

The second memory bank 500<2> may be disposed in the second central region ARCR<2>. The second memory bank 500<2> may include a second memory array ARR<2>, a second confirmation generating part 510<2> and a second data read driving part 520<2>.

The second memory array ARR<2> may include memory cells MCs, which are arranged in the matrix composed of word lines WLs and bit lines BLs.

In this specification, for simplicity of explanation, the detailed description of the configuration and specification of the memory cell MC, and the process of reading the cell data from the memory cell MC is omitted.

The data control block 600 may be disposed in the peripheral area ARPR. The data control block 600 may generate a read command signal XCRMD according to the read command CMD.

The data control block 600 may receive the global read data GDA, which is loaded in the global data wiring GDL. The data control block 600 may provide the buffered global read data GDA to the outside.

The command wiring LCM may be extended from the data control block 600. The command wiring LCM may be wired through the first to the second central region ARCR<1> to ARCR<2>.

The command wiring LCM may transfer the read command signal XCRMD, which is generated from the data control block 600.

The global data wiring GDL may be extended from the data control block 600. The global data wiring GDL may be wired through the first to the second central region ARCR<1> to ARCR<2>. The global data wiring GDL may transfer a global read data GDA to the data control block 600.

The first confirmation generating part 510<1> of the first memory bank 500<1> may receive, in the first central region ARCR<1>, the read command signal XCRMD, which is transferred through the command wiring LCM. The first confirmation generating part 510<1> of the first memory bank 500<1> may generate a first read confirmation signal XBCF<1>. The first read confirmation signal XBCF<1> may be activated in response to the activation of the read command signal XCRMD when a first bank enable signal BKEN<1> is activated. The first bank enable signal BKEN<1> may be activated according to the selection of the first memory bank 500<1>.

The second confirmation generating part 510<2> of the second memory bank 500<2> may receive, in the second central region ARCR<2>, the read command signal XCRMD, which is transferred through the command wiring LCM. The second confirmation generating part 510<2> of the second memory bank 500<2> may generate a second read confirmation signal XBCF<2>. The second read confirmation signal XBCF<2> may be activated in response to the activation of the read command signal XCRMD when a second bank enable signal BKEN<2> is activated. The second bank enable signal BKEN<2> may be activated according to the selection of the second memory bank 500<2>.

The first data read driving part 520<1> may receive the first read confirmation signal XBCF<1>. The first data read driving part 520<1> may amplify a first read local data LDA<1>. The amplified first read local data LDA<1> may be provided, as the global read data GDA, to the global data wiring GDL in the first central region ARCR<1> according to the activation of the first read confirmation signal XBCF<1>. Herein, the first read local data LDA<1> may be the cell data of the selected memory cell MC of the first memory bank ARR<1>.

The time from the generating of the read command CMD to the provision of the first local read data LDA<1> to the global data wiring GDL may include a first delay control time Tdc<1>.

The second data read driving part 520<2> may receive the second read confirmation signal XBCF<2>. The second data read driving part 520<2> may amplify a second read local data LDA<2>. The amplified second read local data LDA<2> may be provided, as the global read data GDA, to the global data wiring GDL in the second central region ARCR<2> according to the activation of the second read confirmation signal XBCF<2>. The second read local data LDA<2> may be the cell data of the selected memory cell MC of the second memory bank ARR<2>.

The time from the generating of the read command CMD to the provision of the second local read data LDA<2> to the global data wiring GDL may include a second delay control time Tdc<2>.

In the semiconductor memory device of FIG. 7, the second delay control time Tdc<2> may be shorter than the first delay control time Tdc<1>.

The second delay control time Tdc<2> may be zero (0).

Figure 8:
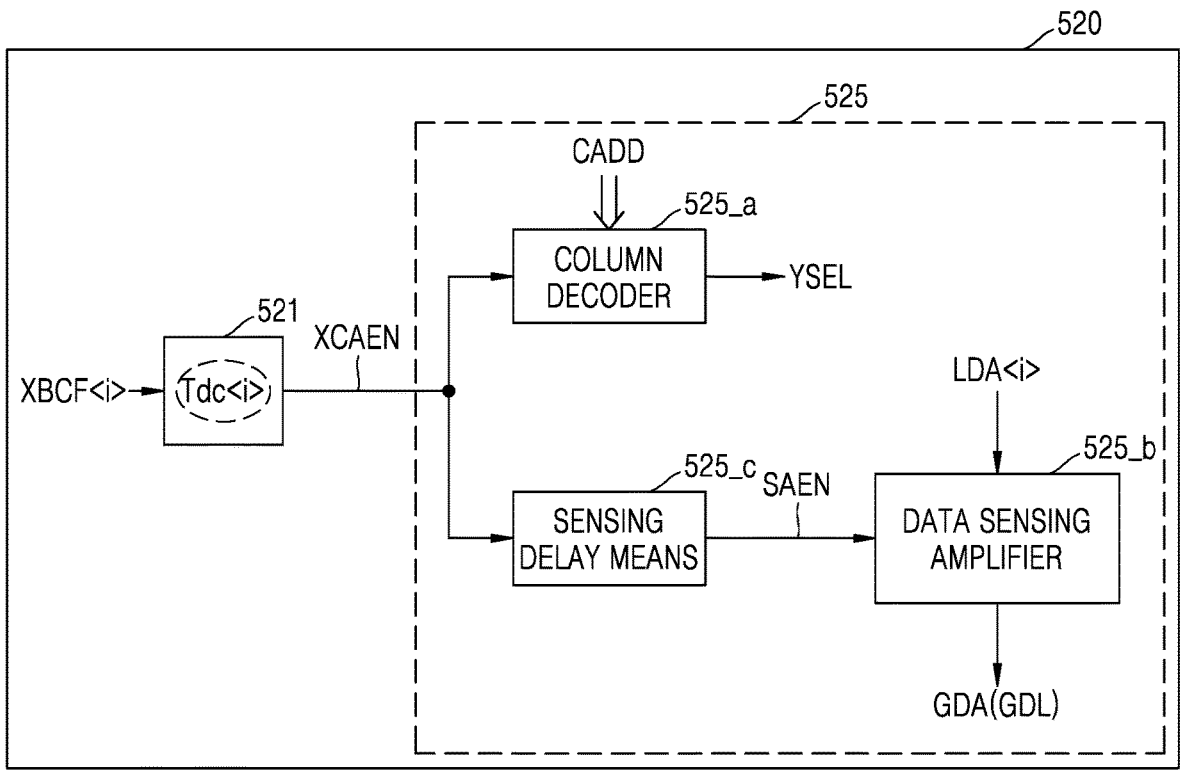
FIG. 8 is a schematic diagram illustrating one of data read driving parts of FIG. 7.

FIG. 8 is a schematic diagram illustrating one of data read driving parts 120 of FIG. 7. Representatively, the i-th data read driving part 520<i> of an i-th memory bank<i> is illustrated, in FIG. 8 (here, "i" is a natural number from 1 to 2).

Referring to FIG. 8, the data read driving part 520<i> of the i-th memory bank<i> may include a command delay part 521 and a data reading part 525.

The command delay part 521 may receive the i-th read command confirmation signal XBCF<i> in the i-th central region ARCR<i>. The i-th read command confirmation signal XBCF<i> may be transferred through the i-th command wiring LCM<i>. The command delay part 521 may delay the i-th read command confirmation signal XBCF<i> with the i-th delay control time Tdc<i> to generate a column enable signal XCAEN.

The data reading part 525 may be enabled in response to the activation of the column enable signal XCAEN. The data reading part 525 may be driven to amplify the i-th local read data LDA<i> and provide the i-th local read data LDA<i> as the global read data GDA to the global data wiring GDL in the i-th central region ARCR<i>.

The data reading part 525 may include a column decoder 525_a and a data sensing amplifier 525_b.

The column decoder 525_a may be enabled in response to the activation of the column enable signal XCAEN. The column decoder 525_a may decode a column address CADD to generate a column selection signal YSEL. The bit line BL of the selected memory cell MC in the i-th memory array ARR<i> may be specified by the column selection signal YSEL.

In this specification, for simplicity of explanation, the detailed description of the configuration and the specification of the column decoder 525 is omitted.

The data sensing amplifier 525_b may be enabled in response to the activation of a sensing enable signal SAEN. A sensing delay part 525_c may delay the column enable signal XCAEN to generate a sensing enable signal SAEN. For example, the data sensing amplifier 525_b may be enabled in response to the activation of the column enable signal XCAEN.

The data sensing amplifier 525_b may be driven to amplify the i-th local read data LDA<i> and provide the i-th local read data LDA<i> as the global read data GDA to the global data wiring GDL in the i-th central region ARCR<i>. The i-th local read data LDA<i> may be a differential type data, and the data sensing amplifier 525_b may be implemented in the form of a differential type amplifier.

In this specification, for simplicity of explanation, the detailed description of the configuration and specification of the data sensing amplifier 525_b is omitted.

Referring again to FIG. 7, the data control block 600 may include a command receiving part 610, and a global data receiving part 630.

The command receiving part 610 may generate the read command signal XCRMD in response to the generation of the read command CMD.

The global data receiving part 630 may receive and recognize the global read data GDA, which is loaded in the global data wiring. The global data receiving part 630 may provide the received global read data GDA to the outside.

According to the semiconductor memory device of FIG. 7, the "data read time difference" between the first memory bank 500<1> and the second memory bank 500<2> may be significantly reduced.

Figure 9:
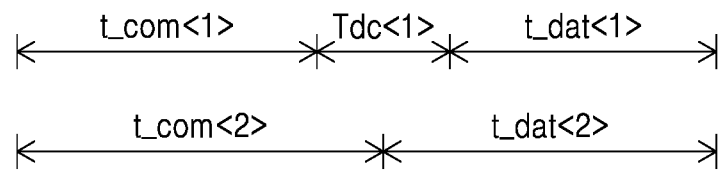
FIG. 9 is a drawing for explaining the reduction of the data read time difference in the semiconductor memory device of FIG. 7.

FIG. 9 is a drawing for explaining the reduction of the data read time difference in the semiconductor memory device of FIG. 7.

In FIG. 9, the time required for the read command signal XCRMD generated in the data control block 600 to arrive at each memory bank 500 through the command wiring LCM from the time when the read command CMD is generated is called as "command arrival time t_com."

The time required for the global read data GDA to arrive at the data control block 600 from the time when the global read data GDA may be loaded into the global data wiring GDL is called as "data arrival time t_dat."

The time taken from the time when the read command signal XCRMD arrives at each memory bank 500 to the time when the global read data GDA is loaded into the global data wiring GDL may be a difference according to the delay control time Tdc between the memory banks. The other times may be substantially the same. Therefore, in this specification, description of the time other than the delay control time Tdc is omitted for convenience of description.

The sum of the "command arrival time t_com" and the "data arrival time t_dat" can be called as the "data read time" of the corresponding memory bank 500. There may be a distance difference for the data control block 600 between the first memory bank 500<1> and the second memory bank 500<2>. Accordingly, there may be a difference in the "data read time" between the first memory bank 500<1> and the second memory bank 500<2>.

The difference in the "data read time" can be called as "data read time difference."

Continuously referring to FIG. 9, the command arrival time t_com<1> and the data arrival time t_dat<1> of the first memory bank 500<1> located relatively close to the data control block 600 may be shorter than the command arrival time t_com<2> and the data arrival time t_dat<2> of the second memory bank 500<2> located relatively far away to the data control block 600.

However, in the first memory bank 500<1> located relatively close to the data control block 600, the time taken from the time when the read command signal XCRMD arrives at the first memory bank 500<1> to the time when the global read data GDA is loaded into the global data wiring GDL may include the first delay control time Tdc<1>.

It is assumed that the second delay control time Tdc<2> is "0."

Accordingly, the "data read time difference" according to the distance difference for the data control block 600 between the first memory bank 500<1> and the second memory bank 500<2> may be reduced. The "data read time difference" may be "0."

As a result, according to the semiconductor memory device of FIG. 7, there may be an effect that the operation margin of the data control block 600 is greatly improved, similar to the semiconductor memory device of FIG. 7.

Forth Embodiment

Figure 10:
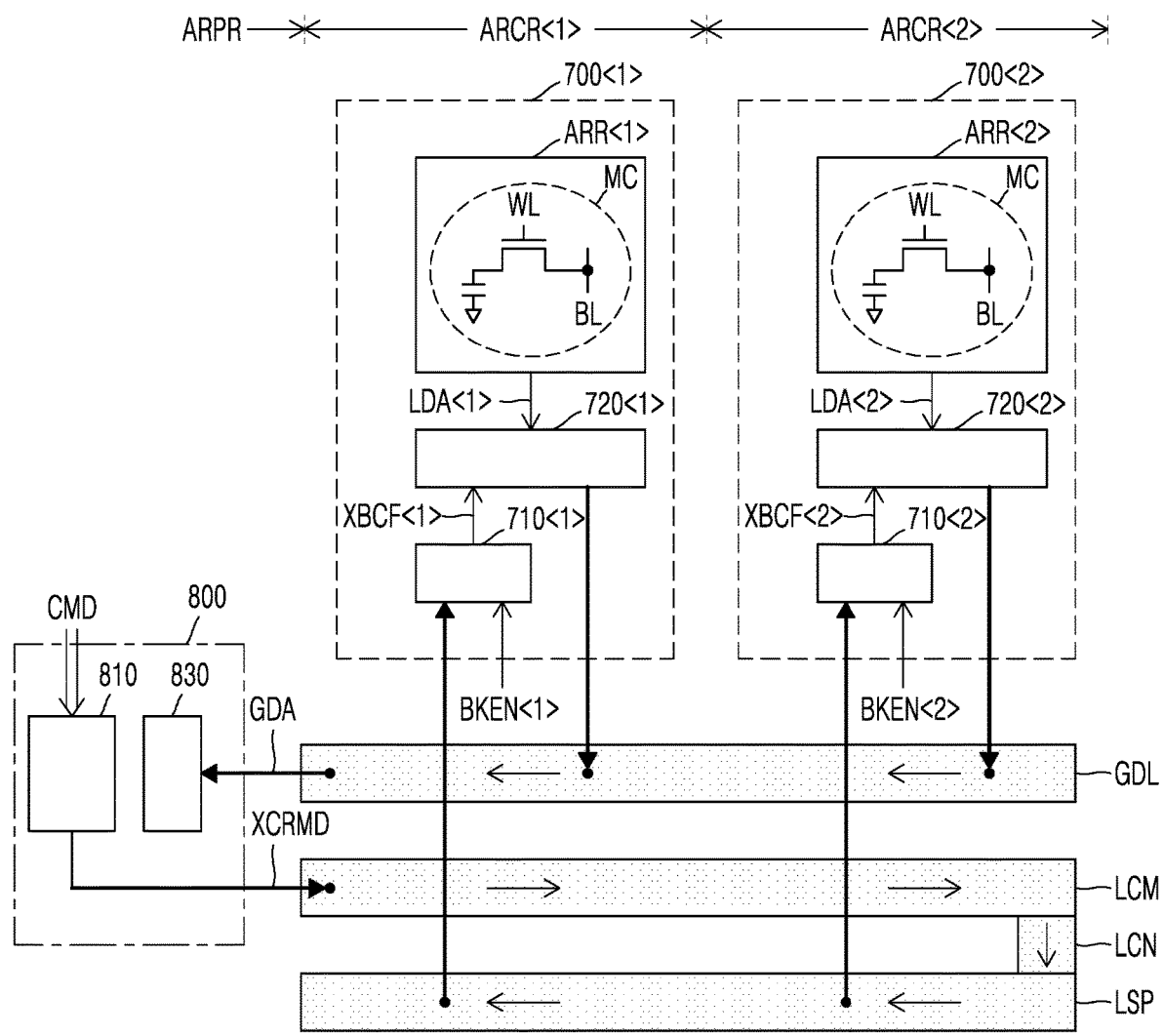
FIG. 10 is a schematic view showing a semiconductor memory device according to a fourth embodiment of the disclosure.

FIG. 10 is a schematic view showing a semiconductor memory device according to a fourth embodiment of the disclosure. In the semiconductor memory device of FIG. 10, there may be a peripheral region ARPR, a first central region ARCR<1> and a second central region ARCR<2>.

The first central region ARCR<1> and the second central region ARCR<2> may be positioned at a sequentially increasing distance from peripheral region ARPR. For example, the distance of the second central region ARCR<2> may be longer than that of the first central ARCR<1> from the peripheral region ARPR.

The semiconductor memory device of FIG. 10 may include a first memory bank 700<1>, a second memory bank 700<2>, a data control block 800, a command wiring LCM, an auxiliary wiring LSP and a global data wiring GDL.

The first memory bank 700<1> may be disposed in the first central region ARCR<1>. The first memory bank 700<1> may include a first memory array ARR<1>, a first confirmation generating part 710<1> and a first data read driving part 720<1>.

The first memory array ARR<1> may include memory cells MCs, which are arranged in the matrix composed of word lines WLs and bit lines BLs.

The second memory bank 700<2> may be disposed in the second central region ARCR<2>. The second memory bank 700<2> may include a second memory array ARR<2>, a second confirmation generating part 710<2> and a second data read driving part 720<2>.

The second memory array ARR<2> may include memory cells MCs, which are arranged in the matrix composed of word lines WLs and bit lines BLs.

In this specification, for simplicity of explanation, the detailed description of the configuration and the specification of the memory cell MC, and the process of reading the cell data from the memory cell MC are omitted.

The data control block 800 may be disposed in the peripheral area ARPR. The data control block 800 may generate a read command signal XCRMD according to the read command CMD.

The data control block 800 may receive the global read data GDA, which is loaded in the global data wiring GDL. The data control block 800 may provide the buffered global read data GDA to the outside.

The command wiring LCM may be extended from the data control block 800. The command wiring LCM may be wired through the first to the second central region ARCR<1> to ARCR<2>.

The command wiring LCM may transfer the read command signal XCRMD, which is generated from the data control block 800.

The auxiliary wiring LSP may be wired through the first central region ARCR<1> and the second central region ARCR<2>. The auxiliary wiring LSP may be electrically connected with the command wiring LCM in the second central region ARCR<2> and may transfer the read command signal XCRMD.

The global data wiring GDL may be extended from the data control block 800. The global data wiring GDL may be wired through the first to the second central region ARCR<1> to ARCR<2>. The global data wiring GDL may transfer a global read data GDA to the data control block 800.

The first confirmation generating part 710<1> of the first memory bank 700<1> may receive, in the first central region ARCR<1>, the read command signal XCRMD, which is transferred through the command wiring LCM. The first confirmation generating part 710<1> of the first memory bank 700<1> may generate a first read confirmation signal XBCF<1>. The first read confirmation signal XBCF<1> may be activated in response to the activation of the read command signal XCRMD when a first bank enable signal BKEN<1> is activated. The first bank enable signal BKEN<1> may be activated according to the selection of the first memory bank 700<1>.

The second confirmation generating part 710<2> of the second memory bank 700<2> may receive, in the second central region ARCR<2>, the read command signal XCRMD, which is transferred through the command wiring LCM. The second confirmation generating part 710<2> of the second memory bank 700<2> may generate a second read confirmation signal XBCF<2>. The second read confirmation signal XBCF<2> may be activated in response to the activation of the read command signal XCRMD when a second bank enable signal BKEN<2> is activated. The second bank enable signal BKEN<2> may be activated according to the selection of the second memory bank 700<2>.

The first data read driving part 720<1> may receive the first read confirmation signal XBCF<1>. The first data read driving part 720<1> may amplify a first read local data LDA<1>. The amplified first read local data LDA<1> may be provided, as the global read data GDA, to the global data wiring GDL in the first central region ARCR<1> according to the activation of the first read confirmation signal XBCF<1>. The first read local data LDA<1> may be the cell data of the selected memory cell MC of the first memory bank ARR<1>.

The second data read driving part 720<2> may receive the second read confirmation signal XBCF<2>. The second data read driving part 720<2> may amplify a second read local data LDA<2>. The amplified second read local data LDA<2> may be provided, as the global read data GDA, to the global data wiring GDL in the second central region ARCR<2> according to the activation of the second read confirmation signal XBCF<2>. The second read local data LDA<2> may be the cell data of the selected memory cell MC of the second memory bank ARR<2>.

Continuously referring again to FIG. 10, the data control block 800 may include a command receiving part 810 and a global data receiving part 830.

The command receiving part 810 may generate a read command signal XCRMD in response to the generation of the read command CMD.

The global data receiving part 830 may receive and recognize the global read data GDA, which is loaded in the global data wiring. The global data receiving part 830 may provide the received global read data GDA to the outside.

According to the semiconductor memory device of FIG. 10, the "data read time difference" between the first memory bank 800<1> and the second memory bank 800<2> may be significantly reduced.

Figure 11:
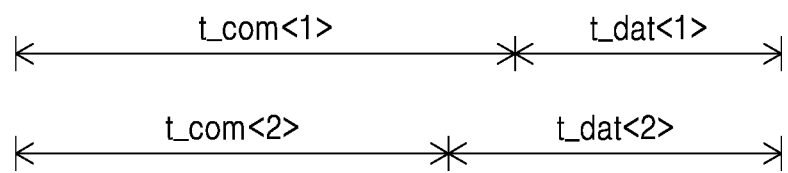
FIG. 11 is a drawing for explaining the reduction of the data read time difference in the semiconductor memory device of FIG. 9.

FIG. 11 is a drawing for explaining the reduction of the data read time difference in the semiconductor memory device of FIG. 10.

In FIG. 11, the time required for the read command signal XCRMD generated in the data control block 800 to arrive at each memory bank 700 through the command wiring LCM from the time when the read command CMD is generated is called as "command arrival time t_com."

The time required for the global read data GDA to arrive at the data control block 800 from the time when the global read data GDA is loaded into the global data wiring GDL is called as "data arrival time t_dat."

The time taken from the time when the read confirmation signal XBCF arrives at each memory bank 700 to the time when the global read data GDA is loaded into the global data wiring GDL may be substantially the same. Therefore, in this specification, description of these times is omitted for convenience of description.

The sum of the "command arrival time t_com" and the "data arrival time t_dat" can be called as the "data read time" of the corresponding memory bank 700. There may be a distance difference for the data control block 800 between the first memory bank 700<1> and the second memory bank 700<2>. Accordingly, there may be a difference in the "data read time" between the first memory bank 700<1> and the second memory bank 700<2>.

The difference in the "data read time" can be called as "data read time difference."

Continuously referring to FIG. 11, the data arrival time t_dat<1> of the first memory bank 700<1> located relatively close to the data control block 800 is shorter than the data arrival time t_dat<2> of the second memory bank 700<2> located relatively far away to the data control block 800.

However, the command arrival time t_com<1> of the first memory bank 700<1> located relatively close to the data control block 800 is longer than the command arrival time t_com<2> of the second memory bank 700<2> located relatively far away to the data control block 800.

Accordingly, the "data read time difference" according to the distance difference for the data control block 800 between the first memory bank 700<1> and the second memory bank 700<2> may be reduced. The "data read time difference" may be "0."

As a result, according to the semiconductor memory device of FIG. 10, there may be an effect that the operation margin of the data control block 800 is greatly improved, similar to the semiconductor memory device of FIG. 1.

While the disclosure has been described with reference to the embodiments shown in the drawings, these embodiments are merely illustrative and it should be understood that various modifications and other equivalent embodiments can be derived by those skilled in the art on the basis of the embodiments.

It will be apparent to those skilled in the art that various modifications can be made to the above-described embodiments of the disclosure without departing from the spirit or scope of the disclosure. Thus, it is intended that the disclosure covers all such modifications provided they come within the scope of the appended claims and their equivalents.

What is claimed is:

1. A semiconductor memory device comprising:
   a peripheral region;
   a first central region and a second central region;
   a first memory bank disposed in the first central region and including:
     a first memory array including memory cells; and
     a first data read driving part;
   a second memory bank disposed in the second central region and including:
     a second memory array including memory cells; and
     a second data read driving part;
   a data control block disposed in the peripheral region and generating a first read confirmation signal and a second read confirmation signal according to a generation of a read command, wherein the first read confirmation signal is activated in response to the generation of the read command when a first bank enable signal is activated, and the first bank enable signal is activated according to a selection of the first memory bank, and the second read confirmation signal is activated in response to the generation of the read command when a second bank enable signal is activated, and the second bank enable signal is activated according to a selection of the second bank;
   a first command wiring extended from the data control block and wired through the first to the second central region, the first command wiring transferring the first read confirmation signal;
   a second command wiring extended from the data control block and wired through the first to the second central region, the second command wiring transferring the second read confirmation signal; and
   a global data wiring extended from the data control block and wired through the first to the second central region, the global data wiring transfers a global read data to the data control block, wherein
   a distance from the peripheral region to the second central region is longer than a distance from the peripheral region to the first central region,
   the first data read driving part of the first memory bank receives, in the first central region, the first read confirmation signal transferred through the first command wiring, and amplifies a first read local data to provide the amplified first read local data as the global read data in the first central region to the global data wiring according to the activation of the first read confirmation signal, the first read local data being a cell data of a selected one of the memory cells of the first memory array,
   the second data read driving part of the second memory bank receives, in the second central region, the second read confirmation signal transferred through the second command wiring, and amplifies a second read local data to provide the amplified second read local data as the global read data in the second central region to the global data wiring according to the activation of the second read confirmation signal, the second read local data being a cell data of a selected one of the memory cells of the second memory array,
   a time from the generating of the read command to the provision of the first local read data to the global data wiring includes a first delay control time, a time from the generating of the read command to the provision of the second local read data to the global data wiring includes a second delay control time, and the second delay control time is shorter than the first delay control time.

2. The semiconductor memory device of claim 1, wherein an i-th data read driving part of an i-th memory bank includes:
a command delay part that receives an i-th read command confirmation signal transferred through an i-th command wiring in an i-th central region and delaying the i-th read command confirmation signal with an i-th delay control time to generate a column enable signal; and
a data reading part enabled in response to the activation of the column enable signal, the data reading part being driven to amplify an i-th local read data to provide the amplified i-th local read data as the global read data to the global data wiring, and
"i" is a natural number from 1 to 2.

3. The semiconductor memory device of claim 2, wherein the data reading part includes:
a column decoder enabled in response to the activation of the column enable signal, the column decoder being driven to specify a bit line of a selected one of the memory cells of an i-th memory array; and
a data sensing amplifier enabled in response to the activation of the column enable signal, the data sensing amplifier being driven to amplify the i-th local read data to provide the amplified i-th local read data as the global read data to the global data wiring in the i-th central region.

4. The semiconductor memory device of claim 1, wherein the second delay control time is zero (0).

5. The semiconductor memory device of claim 1, wherein the data control block includes:
a command receiving part that generates a read command signal in response to the generation of the read command;
a first confirmation generating part that generates the first read confirmation signal; and
a second confirmation generating part that generates the second read confirmation signal.

6. A semiconductor memory device comprising:
a peripheral region;
a first central region and a second central region;
a first memory bank disposed in the first central region and including:
a first memory array including memory cells; and
a first data read driving part;
a second memory bank disposed in the second central region and including:
a second memory array including memory cells; and
a second data read driving part;
a data control block disposed in the peripheral region and generating a first read confirmation signal and a second read confirmation signal according to the generation of a read command, wherein the first read confirmation signal is activated in response to the generation of the read command when a first bank enable signal is activated, and the first bank enable signal is activated according to a selection of the first memory bank, and the second read confirmation signal is activated in response to the generation of the read command when a second bank enable signal is activated, and the second bank enable signal is activated according to a selection of the second bank;
a first command wiring extended from the data control block and wired through the first to the second central region, the first command wiring transferring the first read confirmation signal;
a second command wiring extended from the data control block and wired through the first to the second central region, the second command wiring transferring the second read confirmation signal;
a first auxiliary wiring wired through the first central region and the second central region, the first auxiliary wiring being electrically connected with the first command wiring in the second central region and transferring the first read confirmation signal;
a second auxiliary wiring wired through the first central region and the second central region, the second auxiliary wiring being electrically connected with the second command wiring in the second central region and transferring the second read confirmation signal; and
a global data wiring extended from the data control block and wired through the first to the second central region, the global data wiring transferring a global read data to the data control block, wherein
a distance from the peripheral region to the second central region is longer than a distance from the peripheral region to the first central region,
the first data read driving part of the first memory bank receives, in the first central region, the first read confirmation signal transferred through the first auxiliary wiring, and amplifies a first read local data to provide the amplified first read local data as the global read data in the first central region to the global data wiring according to the activation of the first read confirmation signal, the first read local data being a cell data of a selected one of the memory cells of the first memory array, and
the second data read driving part of the second memory bank receives, in the second central region, the second read confirmation signal transferred through the second auxiliary wiring, and amplifies a second read local data to provide the amplified second read local data as the global read data in the second central region to the global data wiring according to the activation of the second read confirmation signal, the second read local data being a cell data of a selected one of the memory cells of the second memory array.

7. The semiconductor memory device of claim 6, wherein the data control block includes:
a command receiving part that generates a read command signal in response to the generation of the read command;
a first confirmation generating part that generates the first read confirmation signal; and
a second confirmation generating part that generates the second read confirmation signal.

8. A semiconductor memory device comprising
a peripheral region;
a first central region and a second central region;
a first memory bank disposed in the first central region and including:
a first memory array including memory cells;
a first confirmation generating part; and
a first data read driving part;
a second memory bank disposed in the second central region and including:
a second memory array including memory cells;
a second confirmation generating part; and a second data read driving part;
a data control block disposed in the peripheral region, the data control block generating a read command signal according to the generation of a read command, the read command signal being activated in response to the generation of the read command;
a command wiring extended from the data control block and wired through in sequence the first to the second central region, the command wiring transferring the read command signal; and
a global data wiring extended from the data control block and wired through in sequence the first to the second central region, the global data wiring transferring a global read data to the data control block, wherein
a distance from the peripheral region to the second central region is longer than a distance from the peripheral region to the first central region,
the first confirmation generating part of the first memory bank receives, in the first central region, the read command signal transferred through the command wiring, and generates a first read confirmation signal, the first read confirmation signal being activated in response to the activation of the read command signal when a first bank enable signal is activated, and the first bank enable signal being activated according to a selection of the first memory bank,
the second confirmation generating part of the second memory bank receives, in the second central region, the read command signal transferred through the command wiring, and generates a second read confirmation signal, the second read confirmation signal being activated in response to the activation of the read command signal when a second bank enable signal is activated, and the second bank enable signal being activated according to a selection of the second memory bank,
the first data read driving part of the first memory bank receives the first read confirmation signal, and amplifies a first read local data to provide the amplified first read local data as the global read data in the first central region to the global data wiring according to the activation of the first read confirmation signal, the first read local data being a cell data of a selected one of the memory cells of the first memory array,
the second data read driving part of the second memory bank receives the second read confirmation signal, and amplifies a second read local data to provide the amplified second read local data as the global read data in the second central region to the global data wiring according to the activation of the second read confirmation signal, the second read local data being a cell data of a selected one of the memory cells of the second memory array,
a time from the generating of the read command to the provision of the first local read data to the global data wiring includes a first delay control time, and a time from the generating of the read command to the provision of the second local read data to the global data wiring includes a second delay control time, and
the second delay control time is shorter than the first delay control time.

9. The semiconductor memory device of claim 8, wherein an i-th data read driving part of an i-th memory bank includes:
a command delay part that receives an i-th read command confirmation signal and delaying the i-th read command confirmation signal with an i-th delay control time to generate a column enable signal; and
a data reading part enabled in response to the activation of the column enable signal and driven to amplify an i-th local read data to provide the amplified i-th local read data as the global read data to the global data wiring, and
"i" is a natural number from 1 to 2.

10. The semiconductor memory device of claim 9, wherein the data reading part includes:
a column decoder enabled in response to the activation of the column enable signal and driven to specify a bit line of a selected one of the memory cells of an i-th memory array; and
a data sensing amplifier enabled in response to the activation of the column enable signal and driven to amplify the i-th local read data to provide the amplified i-th local read data as the global read data to the global data wiring in an i-th central region.

11. The semiconductor memory device of claim 10, wherein the second delay control time is zero (0).

12. A semiconductor memory device comprising:
a peripheral region;
a first central region and a second central region;
a first memory bank disposed in the first central region and including:
a first memory array including memory cells;
a first confirmation generating part; and
a first data read driving part;
a second memory bank disposed in the second central region and including:
a second memory array including memory cells;
a second confirmation generating part; and
a second data read driving part;
a data control block disposed in the peripheral region, the data control block generating a read command signal according to the generation of a read command, the read command signal being activated in response to the generation of the read command;
a command wiring extended from the data control block and wired through the first to the second central region, the command wiring transferring the read command signal;
an auxiliary wiring wired through the first central region and the second central region, the auxiliary wiring being electrically connected with the command wiring in the second central region and transferring a read confirmation signal; and
a global data wiring extended from the data control block and wired through the first to the second central region, the global data wiring transferring a global read data to the data control block,
wherein a distance from the peripheral region to the second central region is longer than a distance from the peripheral region to the first central region.

13. The semiconductor memory device of claim 12, wherein
the first confirmation generating part of the first memory bank receives, in the first central region, the read command signal transferred through the auxiliary wiring, and generates a first read confirmation signal,
the first read confirmation signal is activated in response to the activation of the read command signal when a first bank enable signal is activated, and
the first bank enable signal is activated according to a selection of the first memory bank.

14. The semiconductor memory device of claim 13, wherein the second confirmation generating part of the second memory bank receives, in the second central region, the read command signal transferred through the auxiliary wiring, and generates a second read confirmation signal, the second read confirmation signal is activated in response to the activation of the read command signal when a second bank enable signal is activated, and the second bank enable signal is activated according to a selection of the second memory bank.

15. The semiconductor memory device of claim 14, wherein the first data read driving part of the first memory bank receives the first read confirmation signal, and amplifies a first read local data to provide the amplified first read local data as the global read data in the first central region to the global data wiring according to the activation of the first read confirmation signal, and the first read local data is a cell data of a selected one of the memory cells of the first memory array.

16. The semiconductor memory device of claim 15, wherein the second data read driving part of the second memory bank receives the second read confirmation signal, and amplifies a second read local data to provide the amplified second read local data as the global read data in the second central region to the global data wiring according to the activation of the second read confirmation signal, and the second read local data is a cell data of a selected one of the memory cells of the second memory array.

* * * * *